United States Patent [19]

Chidhambarakirshnan

[11] Patent Number: 5,715,408
[45] Date of Patent: Feb. 3, 1998

[54] INTERCONNECT TERMINATION FOR HIGH SPEED CIRCUITS

[75] Inventor: Kumar Chidhambarakirshnan, Medford, Mass.

[73] Assignee: Cadence Design System, Inc., San Jose, Calif.

[21] Appl. No.: 636,770

[22] Filed: Apr. 19, 1996

[51] Int. Cl.[6] .............................. G06F 15/00; G06F 17/50
[52] U.S. Cl. .............................. 395/306; 326/30; 326/86; 370/420; 327/108; 364/488; 364/578; 333/124; 379/398
[58] Field of Search .............................. 395/306; 326/30, 326/86; 370/420; 327/108; 364/488, 578; 333/124; 379/398

[56] References Cited

U.S. PATENT DOCUMENTS

| | | | |
|---|---|---|---|
| 5,031,111 | 7/1991 | Chao et al. | 364/491 |
| 5,402,485 | 3/1995 | Takato et al. | 379/402 |
| 5,422,317 | 6/1995 | Hua et al. | 437/250 |
| 5,430,400 | 7/1995 | Herlein et al. | 327/108 |
| 5,572,437 | 11/1996 | Rostoker et al. | 364/489 |
| 5,610,833 | 3/1997 | Chang et al. | 364/491 |
| 5,617,326 | 4/1997 | Yamamoto | 364/488 |

*Primary Examiner*—Jack B. Harvey
*Assistant Examiner*—Jigar Pancholi
*Attorney, Agent, or Firm*—Townsend and Townsend and Crew LLP

[57] ABSTRACT

A termination synthesis technique that automatically derives an optimum termination scheme for interconnects in electronic circuits. The termination synthesis technique uses an adaptive partitioning approach to divide a large circuit into separate clusters that can be independently terminated. The technique can thus automatically derive the optimum termination type and location for large and complex circuits.

11 Claims, 4 Drawing Sheets

INTERCONNECT TERMINATION FOR HIGH SPEED CIRCUITS

BACKGROUND OF THE INVENTION

The present invention relates in general to computer aided design (CAD) tools used in design and development of electronic circuits and systems, and in particular to a synthesis technique that automatically derives optimum termination schemes for interconnects in such systems.

A common problem in electronic circuits is signal distortion caused by improperly terminated transmission lines or long interconnects. Termination refers to insertion of impedance along a transmission line whose value is adjusted to match the effective impedance of the driver and the transmission line. Without such matching impedance, the signal travelling the length of the interconnect experiences "reflection" (i.e., bouncing back along the interconnect line in the form of a return signal). Reflection causes undesired signal oscillation and, under severe conditions, may result in excessive delays and false logic switching. The problem is more acute in the case of high speed and high performance systems, where interconnect and delays associated with them play a more critical role in the overall system performance.

Properly terminated interconnects are therefore critical in order to minimize signal distortion and improve high frequency performance. Determining the required termination, however, is usually not a trivial task and often involves exhaustive trial and error simulations, specially for more complex circuits. The process typically involves an initial step of determining whether termination is required at all. Circuit functionality is simulated to analyze whether, for example, undershoot constraints are violated. Based on the results of the simulated distortion and noise levels, a specific type of termination may be selected from two general classes of terminations. These are shunt and series terminations.

Next, the proper location for inserting the termination must be identified. This is the most intractable step in the process since it depends on numerous factors and requires expert knowledge and exhaustive simulations. For critical circuits, deciding on the location of termination becomes a highly sophisticated art and is usually performed manually by skilled designers. For even moderately complex circuits, a considerable amount of time and effort is thus consumed by the process of defining a termination scheme. In the case of shunt terminations the problem of deciding on the number of terminations and locating them is particularly acute. Moreover, for more complex designs with thousands of devices and interconnects, manually developing termination schemes to control distortion is practically impossible.

There is therefore a need for improved methods of determining termination schemes for more complex and high speed circuits and systems.

SUMMARY OF THE INVENTION

The present invention provides an automated method of deriving an optimum termination scheme to minimize distortion and noise in electronic circuits and systems. According to one embodiment, the invention provides a method of deriving a termination scheme for a circuit, which includes machine executed steps of: (a) examining circuit performance to determine whether termination is required; (b) determining a termination type and value; (c) deriving an optimum location for the termination; (d) inserting the termination and verifying effect of termination; and (e) repeating steps (a) through (d) until circuit termination requirements are met.

In a more specific embodiment of the present invention the step of determining a termination type and value includes a further step of (f) deriving circuit electrical characteristics including driver types and slew rates, and interconnect load impedances and delays. Further, the step of deriving an optimum location for the termination includes an additional step of (g) adaptive partitioning of the circuit into clusters of load circuits.

A better understanding of the nature and advantages of the present invention may be had with reference to the detailed description and the accompanying drawings below.

DESCRIPTION OF THE PREFERRED EMBODIMENT

Figure 1:
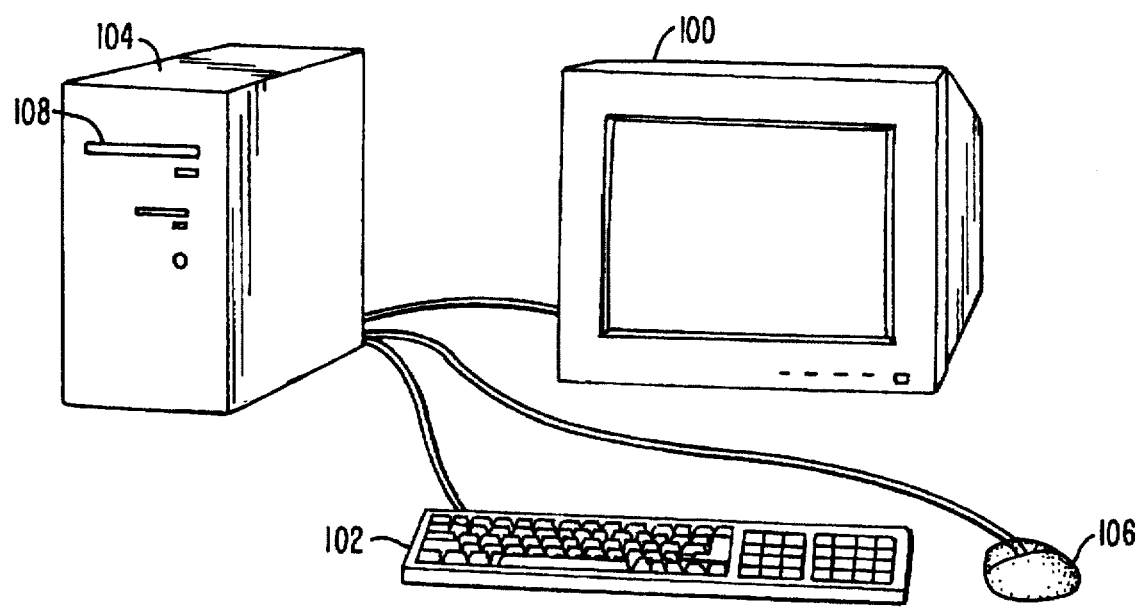
FIG. 1 shows an exemplary CAD workstation wherein the termination synthesizer according to the present invention resides.

The method and technique of the present invention is implemented within a CAD environment and typically resides inside a computer workstation used by design engineers. FIG. 1 shows a typical example of a computer workstation which houses various CAD modules such as circuit simulation and layout tools and the like. The workstation includes monitor 100, keyboard 102, cabinet 104 and mouse 106. Cabinet 104 houses a CD-ROM drive 108 or a hard drive (not shown) which may be utilized to store and retrieve CAD tools incorporating the present invention, digital images for use with the present invention, and the like. Although a CD-ROM 108 is shown as the removable media, other removable tangible media including floppy disks, tape, and flash memory may be utilized. Cabinet 104 also houses familiar computer components (not shown) such as a processor, memory, and various support network elements that execute CAD tools such as the termination synthesis module of the present invention. The computer workstation shown in FIG. 1 is but an example of a computer system suitable for use with the present invention. Other configurations of subsystems suitable for use with the present invention will be readily apparent to one of ordinary skill in the art.

Figure 2:
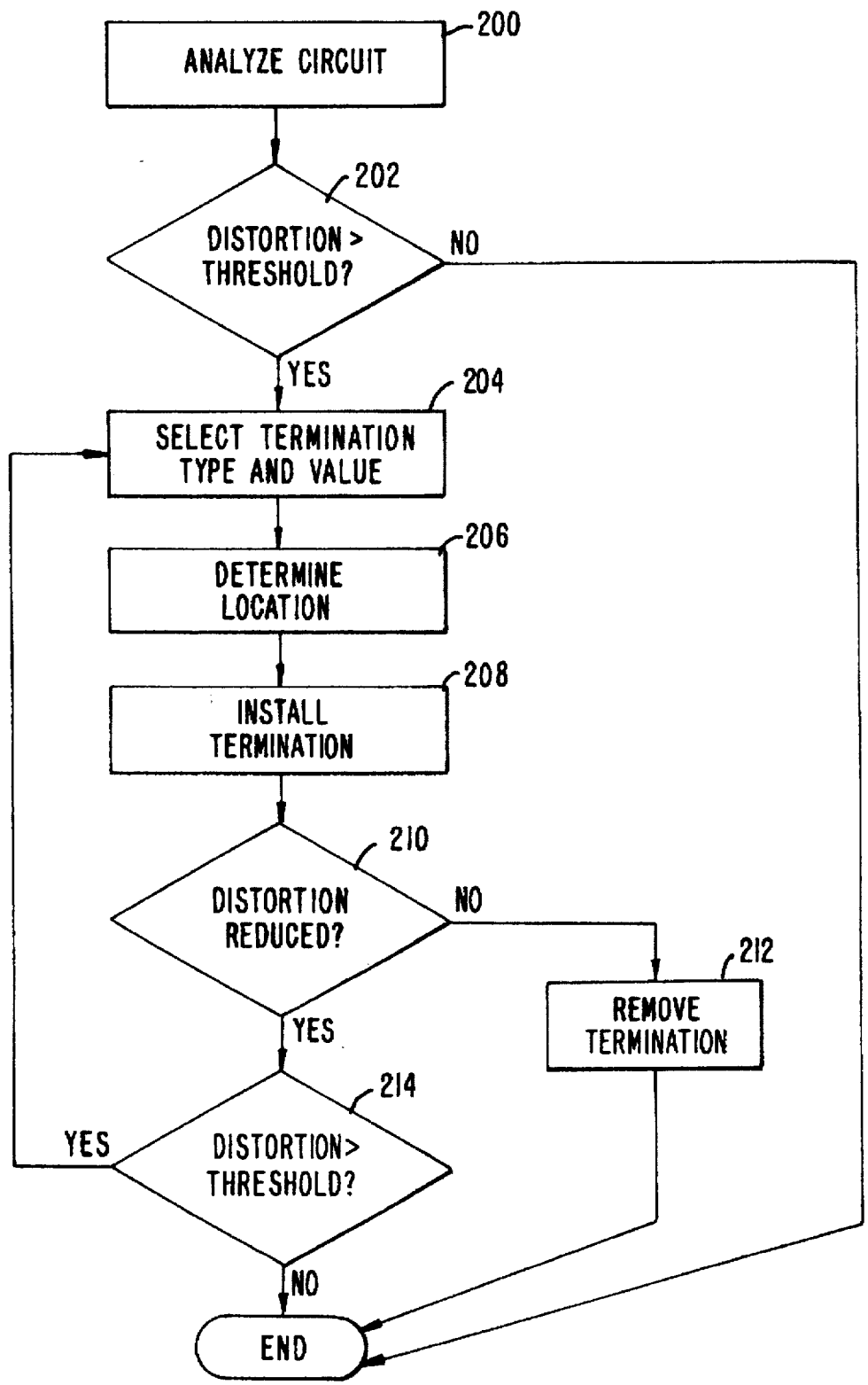
FIG. 2 is a flow diagram illustrating at a high level the termination synthesis method of the present invention.

FIG. 2 is a flow diagram illustrating at a high level the termination synthesis technique according to the present invention. The circuit performance is first analyzed (step 200) to determine distortion levels. This is accomplished by computer simulation of circuit functionality to observe signal behavior at various critical nodes within the circuit. A typical parameter that indicates the level of distortion is signal undershoot (or overshoot). If any signal exhibits distortion levels above an acceptable threshold level (i.e., undershoot constraint violated), the method of the invention initially assumes that there exist interconnect lines that are not properly terminated.

With an initial determination that termination is required, a terminator type and value is next selected (step 204). The types of terminators available are, for example, series (R1), shunt (R1, V1), thevenin (R1, V1, R2, V2), shunt RC (R1, C1, V1), clamp ($V_{cutoff1}$, V1), or dual clamp ($V_{cutoff1}$, V1, $V_{cutoff2}$, V2). A preferred embodiment of the termination synthesizer of the present invention provides the optional parameters inside the parenthesis, where R1 and R2 are resistor values, V1 and V2 are termination voltages, C1 is the capacitance, and $V_{cutoff1}$ and $V_{cutoff2}$ are the diode low and diode high cutoff voltages, respectively. The user has the option of either invoking the synthesizer with termination type and value specified, or with type only or with type and all or some of the terminator values specified. Terminator type and value are otherwise automatically derived by the synthesizer.

Determining the type of terminator involves an examination of the type of circuit that drives the signal over the critical interconnect line. The synthesizer examines the circuit and if it finds the driver circuit to be of an open type (e.g., open-collector as in emitter-coupled logic, ECL, or open-drain), it automatically inserts a DC shunt or DC thevenin terminator. If the circuit is not open and the type of terminator is not specified, then a default series type terminator is chosen.

In the absence of user-specified values, the synthesizer then automatically derives values for the terminator parameters based on the type of terminator. In the case of shunt or thevenin terminators, for example, the value of the terminator voltages are obtained by examining the drivers in the circuit. The value of the terminator resistors are approximated as the average transmission line impedance in the circuit. In the case of series termination resistors the value is given by R=Zo−Rs, where Zo is the average transmission line impedance of the circuit and Rs is the characteristic source impedance of the fastest driver in the circuit. It is based on the circuit behavioral models that the synthesizer predicts the operating impedances for the source and the load.

Once the termination type and value are derived, the synthesizer must determine the optimum location to insert the termination (step 206). According to a preferred embodiment of this invention, this step involves a complex adaptive partitioning of the circuit into clustered networks each requiring a separate termination. This step is described in greater detail hereinafter in connection with FIGS. 3, 4A and 4B. In the case of a smaller circuit, the synthesizer may determine that a location is not available (i.e., no clusters identified). Under such conditions the synthesizer concludes that the measured noise or distortion levels are not due to lack of termination and ends the process.

If the synthesizer identifies one or more clusters, the termination as defined in the preceding steps is inserted at the identified location (step 208). Next, the effectiveness of the added termination is verified by analyzing circuit performance once again (step 210) to check for constraint violations. If simulation results indicate that distortion has not been reduced, the synthesizer concludes that the measured distortion is not caused by improper termination, removes the termination and exits the program. If a reduction in distortion level is realized, however, the synthesizer repeats the process for additional terminators until the distortion level drops below the predetermined threshold level.

Figure 3:
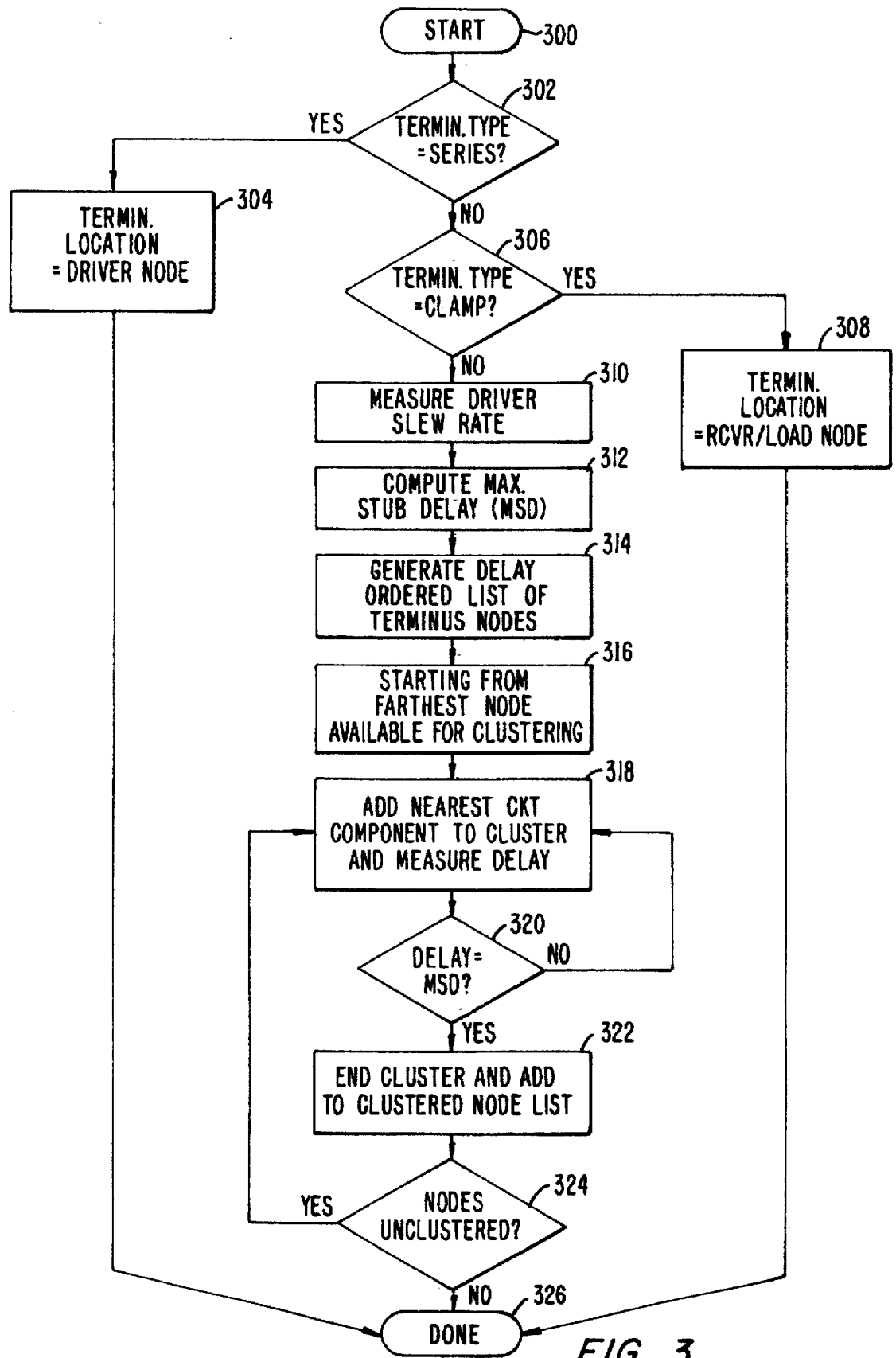
FIG. 3 is a flow diagram showing a method for determining an optimum location for installing termination.

An important aspect of the termination synthesis technique of the present invention is the process of determining the optimum location for terminators. FIG. 3 is a flow diagram illustrating the process of termination location according to the present invention. In the case of series type terminators, the location is readily defined at the driver node (steps 302 and 304). Similarly, the location for a clamp or dual clamp terminator is readily defined at the receiver/load end (steps 306 and 308). For the remaining group of terminator types, namely shunt, shunt RC, thevenin, and the like, an adaptive partitioning technique is used to accurately locate the termination within the circuit.

The key factors to be considered in deciding on a location for the termination are driver switching speed and delay through the load circuit. The adaptive partitioning technique of the present invention divides the circuit into a number of clusters of components, with each cluster defined by a delay parameter. The delay parameter is based on the slew rate (i.e., switching speed) of the fastest driver. Accordingly, for this group of terminator types, the method of this invention first measures the driver slew rate (step 310). Next, the clustering delay parameter, referred to herein as the maximum stub delay, or MSD, is computed based on the driver slew rate (step 312). The MSD is set at a small fraction, for example 1/20, of the driver slew rate. A cluster is then defined as that part of the circuit that has a delay equal to the MSD.

After computing the MSD, a delay ordered list of terminus nodes with the farthest node being the first in the list is generated (step 314). Then, starting from the farthest node that is available for clustering (step 316), delay is measured as circuit components are added one at a time (step 318). The node at which the measured delay equals the MSD is designated as the cluster boundary, and is added to the list of clustered nodes (steps 320 and 322). The list of clustered nodes identifies the nodes where a terminator is installed. If there remain other components and nodes within the circuit this process continues (step 324) until the entire circuit is divided into one or more clusters identified by a list of clustered nodes.

Figure 4A:
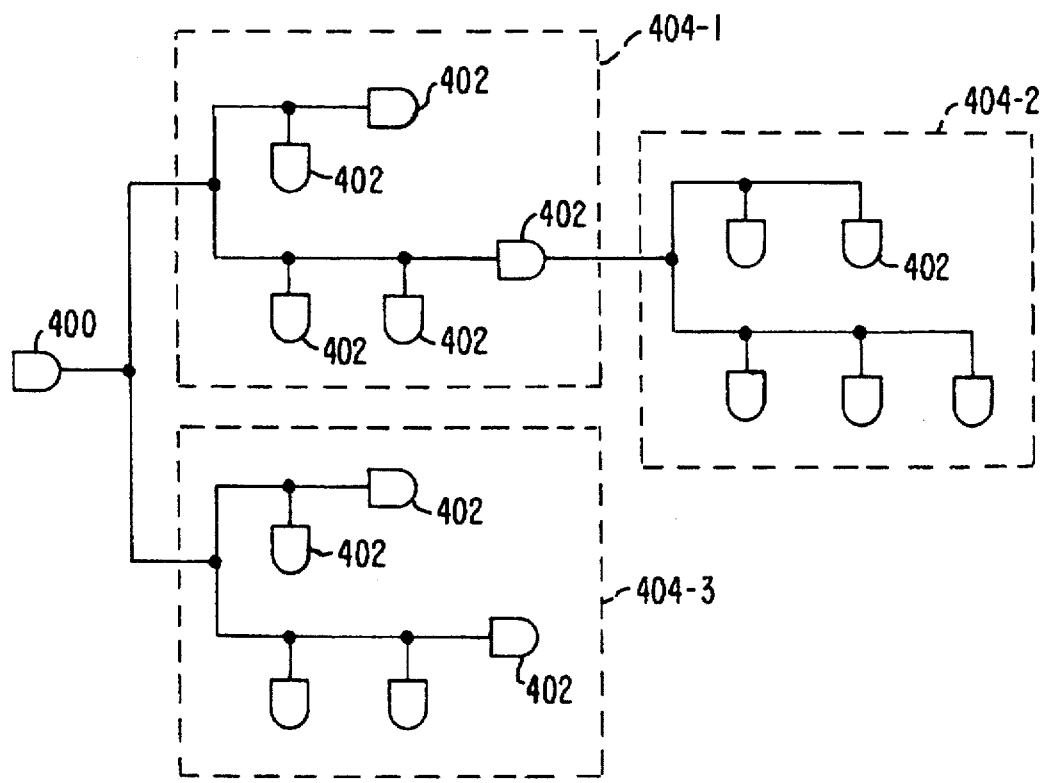
FIGS. 4A and 4B illustrate the adaptive partitioning of technique of the present invention with an exemplary circuit.
Figure 4B:
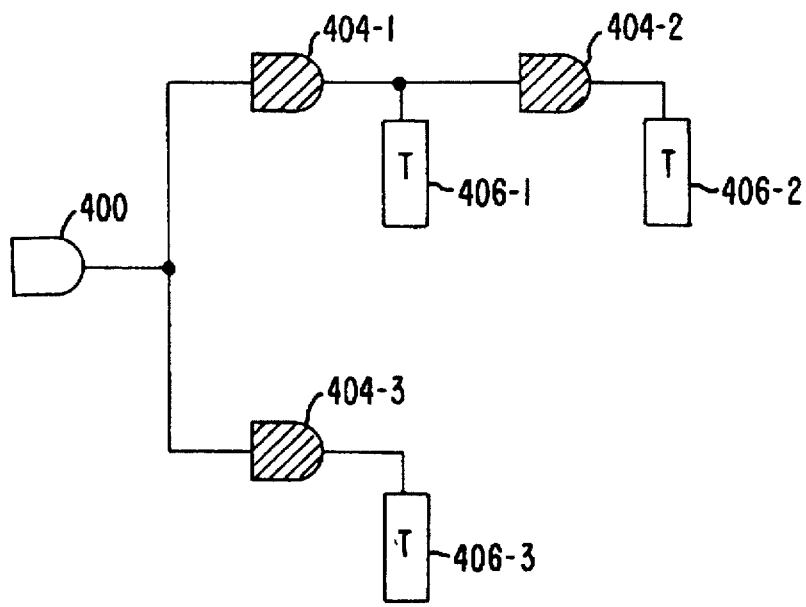

This adaptive partitioning or clustering process is depicted by the exemplary circuit of FIGS. 4A and 4B, which are shown herein for illustrative purposes only. Referring to FIG. 4A there is shown an exemplary driver 400 driving a load circuit that includes a network of components 402. In this example, the load circuit is divided by the synthesis process into three clusters 404-1, 404-2, and 404-3. Each cluster 404 exhibits a delay equal to the measured maximum stub delay, and can be separately terminated. Terminations 406-1, 406-2, and 406-3 are then installed at the terminus node of each driver as shown. The selection of the type of termination is described as above.

Thus, the termination synthesis technique of the present invention provides an automated method of deriving optimum termination schemes for electronic circuits regardless of their size and complexity. While the above is a complete description of a specific embodiment of the present invention, it is possible to use various alternatives, modifications and equivalents. For example, options can be provided to allow the user to specify and thus override types of terminations or values for terminator elements at any stage of the synthesis process. The scope of the present invention should therefore not be determined with reference to the above description, but should instead, be determined with reference to the appended claims along with their full scope of equivalents.

What is claimed is:

1. A method for deriving a termination scheme for one or more interconnects in an electronic circuit, comprising the machine executed steps of:

(A) examining circuit performance to determine whether termination is required;

(B) determining a termination type and value;

(C) deriving an optimum location for the termination;

(D) inserting the termination and verifying effect of termination; and (E) repeating steps (A) through (D) until circuit termination requirements are met.

2. The method of claim 1 wherein the step of determining a termination type and value comprises a step of deriving circuit electrical characteristics including driver types and slew rates, and interconnect load impedances and delays.

3. The method of claim 1 wherein the step of deriving an optimum location for the termination comprises a step of adaptive partitioning of the circuit into clusters of load circuits.

4. The method of claim 3 wherein the step of adaptive partitioning comprises the steps of:

(F) measuring a slew rate of a driver element in the circuit;

(G) computing a cluster delay parameter based on the measured slew rate of the driver element;

(H) defining a cluster as a group of load circuit elements that exhibit a collective delay substantially equal to the cluster delay parameter.

5. The method of claim 4 wherein the step of defining a cluster further comprises the steps of:

(I) generating a delay ordered list of terminus nodes of the circuit with a farthest node being first in the list;

(J) starting from the farthest node;

(K) forming a cluster by adding nearest circuit component;

(L) measuring a delay through the cluster;

(M) repeating steps (K) through (L) until the delay through the cluster substantially equals the cluster delay parameter;

(N) ending clustering if no other terminus nodes exist, otherwise;

(O) moving to a next terminus node on the list and repeating steps (K) through (N) for another cluster.

6. A method of deriving an optimum location to install a termination element in an electronic circuit, comprising the machine executed steps of:

(A) measuring a switching speed of a driver element in the circuit;

(B) defining a clustering delay parameter as a fraction of the measured switching speed;

(C) partitioning the circuit into one or more clusters of load circuits, with each cluster defined by a group of circuit elements that exhibit a collective delay substantially equal to the clustering delay parameter; and (D) installing the termination element at a first terminal of a cluster.

7. The method of claim 6 wherein the step of partitioning the circuit into one or more clusters of load circuit, further comprises the steps of:

(E) generating a delay ordered list of terminus nodes of the circuit with a farthest node being first in the list;

(F) starting from the farthest node;

(J) forming a cluster by adding nearest circuit component;

(K) measuring a delay through the cluster;

(L) repeating steps (J) through (K) until the delay through the cluster substantially equals the cluster delay parameter;

(M) ending clustering if no other terminus nodes exist, otherwise;

(N) moving to a next terminus node on the list and repeating steps (J) through (M) for another cluster.

8. A computer program product having a computer usable medium including a computer readable code embodied therein for deriving an optimized termination scheme for interconnects in an electronic circuit, said computer program product comprising:

computer readable program code devices configured to examine the circuit to determine if termination is required;

computer readable program code devices configured to determine termination type and value;

computer readable program code devices configured to derive an optimum location for the termination;

computer readable program code devices configured to insert the termination and verify effect of termination.

9. The computer program product of claim 8 wherein the computer readable program code devices configured to derive an optimum location for the termination further comprise computer readable program code devices configured to adaptively partition the circuit into clusters of load circuits.

10. The computer program product of claim 9 wherein the computer readable program code devices configured to adaptively partition the circuit into clusters of load circuits further comprise:

computer readable program code devices configured to measure a slew rate of a driver element in the circuit;

computer readable program code devices configured to compute a cluster delay parameter based on the measured slew rate of the driver element;

computer readable program code devices configured to define a cluster as a group of load circuit elements that exhibit a collective delay substantially equal to the cluster delay parameter.

11. The computer program product of claim 10 wherein the computer readable program code devices configured to define a cluster further comprise:

computer readable program code devices configured to generate a delay ordered list of terminus nodes of the circuit with a farthest node being first in the list;

computer readable program code devices configured to start from the farthest node;

computer readable program code devices configured to form a cluster by adding nearest circuit component;

computer readable program code devices configured to measure a delay through the cluster; and computer readable program code devices configured to repeating end clustering when the delay through the cluster substantially equals the cluster delay parameter, and no other terminus nodes exist.

* * * * *